United States Patent [19]
Jiang et al.

[11] Patent Number: 5,974,071
[45] Date of Patent: Oct. 26, 1999

[54] VCSEL WITH INTEGRATED PHOTODETECTORS FOR AUTOMATIC POWER CONTROL AND SIGNAL DETECTION IN DATA STORAGE

[75] Inventors: Wenbin Jiang, Phoenix; Michael S. Lebby, Apache Junction, both of Ariz.

[73] Assignee: Motorola, Inc., Schaumburg, Ill.

[21] Appl. No.: 08/859,449

[22] Filed: May 20, 1997

[51] Int. Cl.[6] .............................. H01S 3/19; H01S 3/08
[52] U.S. Cl. ............................................. 372/50; 372/96
[58] Field of Search ................................ 372/50, 96, 31, 372/92; 438/23

[56] References Cited

U.S. PATENT DOCUMENTS

| | | | |
|---|---|---|---|
| 5,574,744 | 11/1996 | Gaw et al. | 372/96 |
| 5,577,064 | 11/1996 | Swirhun et al. | 372/50 |
| 5,606,572 | 2/1997 | Swirhun et al. | 372/50 |
| 5,663,944 | 9/1997 | Mun | 372/50 |
| 5,732,101 | 3/1998 | Shin | 372/50 |
| 5,737,348 | 4/1998 | Smith | 372/31 |
| 5,757,837 | 5/1998 | Lim et al. | 372/50 |

Primary Examiner—Rodney Bovernick
Assistant Examiner—Quyen Phan Leung
Attorney, Agent, or Firm—Eugene A. Parsons; William E. Koch

[57] ABSTRACT

A VCSEL with a vertically integrated photodetector and at least one laterally integrated photodetector, including first and second stacks of DBRs and an undoped region or active region sandwiched therebetween is formed. The vertically and laterally integrated PIN photodetectors are integrated into the device by depositing the region of undoped material in alignment with the first stack of DBRs. The device is fabricated to electrically isolate the vertical cavity surface emitting laser and the vertically integrated photodetector from the at least one laterally integrated photodetector.

19 Claims, 2 Drawing Sheets

VCSEL WITH INTEGRATED PHOTODETECTORS FOR AUTOMATIC POWER CONTROL AND SIGNAL DETECTION IN DATA STORAGE

FIELD OF THE INVENTION

This invention relates, in general, to optical devices and, more particularly, to integrated light emitting devices and photodetectors.

BACKGROUND OF THE INVENTION

Automatic power control (APC) of light emitting devices allows for a constant and a consistent output from these devices. Generally, automatic power control of edge emitting laser devices is easily achieved because edge emitting devices emit light from two ends. Thus, enabling one of the light emitting ends to be used to measure the power output, which is subsequently use to adjust the power input to the edge emitting device, thereby adjusting the power output.

However, automatic power control of a vertical cavity surface emitting laser (VCSEL) having a wavelength of less than 875 nm is a difficult task because the gallium arsenide (GaAs) VCSEL substrate is absorptive to the band width emission, thus making measurement of the output and subsequent adjustment thereof a difficult task. Conventionally, in order to accomplish this task, several optical devices, such as photodiodes or photodetectors, mirrors, beam splitters, and the like are positioned manually in the optical path of the emission from the VCSEL. With the optical devices being positioned manually, several problems or disadvantages result, such as a high cost of manufacture, a lack of repeatability, and poor quality control.

In addition, in scanning type optical data storage, such as tape based rapid access data storage systems, VCSELs are typically used as the light source. The problem arises in the reading of recorded media on the data storage device, such as a CD or DVD. Typically, a photodetector, or detecting array, separately fabricated from that of the VCSEL is utilized to detect a return signal from the recorded media, which leads to a complex pickup head design. This presents an even greater problem when an array of VCSELs is used for parallel data reading.

During operation, when a focused light beam hits the recorded media, the beam is diffracted back toward the lens and pickup system. The diffracted beam is a SinC function, meaning the light is diffracted back as a center 0 order mode and two side lobes that are ±1 order mode. The 0 order mode will trace back the original path of the incident beam with identical geometric dimension. The ±1 order modes have a larger divergence angle, and will be collimated by the focal lens back toward the original light source, but with a larger dimension.

Accordingly, it can be readily seen that conventional VCSELs and signal detection from recorded media has several disadvantages and problems, thus not enabling their manufacture in a compact form. Therefore, an integrated article and method for making same that simplifies the fabrication process, reduces cost, and improves reliability would be highly desirable.

It is a purpose of the present invention to provide a new and improved integrated VCSEL and photodetectors for automatic power control (APC) of the VCSEL emission and return signal detection in a data storage read mode.

It is another purpose of the present invention to provide a new and improved integrated VCSEL and photodetectors which are simple and relatively inexpensive to manufacture.

It is still another purpose of the present invention to provide a new and improved integrated VCSEL and photodetectors which are integrated with a minimum of labor and cost.

It is a further purpose of the present invention to provide a new and improved integrated VCSEL and photodetector which can be utilized to control the output of the VCSEL and detection of RF signals in a read mode.

SUMMARY OF THE INVENTION

The above problems and others are at least partially solved and the above purposes and others are realized in a device including a vertical cavity surface emitting laser with a vertically integrated PIN photodetector and at least one laterally integrated PIN photodetector. The device includes a first stack of distributed Bragg reflectors, an active area disposed on the first stack of distributed Bragg reflectors, and a second stack of distributed Bragg reflectors disposed on the active area. The device is fabricated to electrically isolate a vertical cavity surface emitting laser, more particularly, an optical pathway through which light is generated and passes, a vertically integrated photodetector and at least one laterally integrated photodetector. The device, more particularly the photodetectors further include a region of undoped material.

BRIEF DESCRIPTION OF THE DRAWINGS

The novel features believed characteristic of the invention are set forth in the claims. The invention itself, however, as well as other features and advantages thereof will be best understood by reference to detailed descriptions which follow, when read in conjunction with the accompanying drawings, wherein:

DESCRIPTION OF THE PREFERRED EMBODIMENTS

Figure 1:
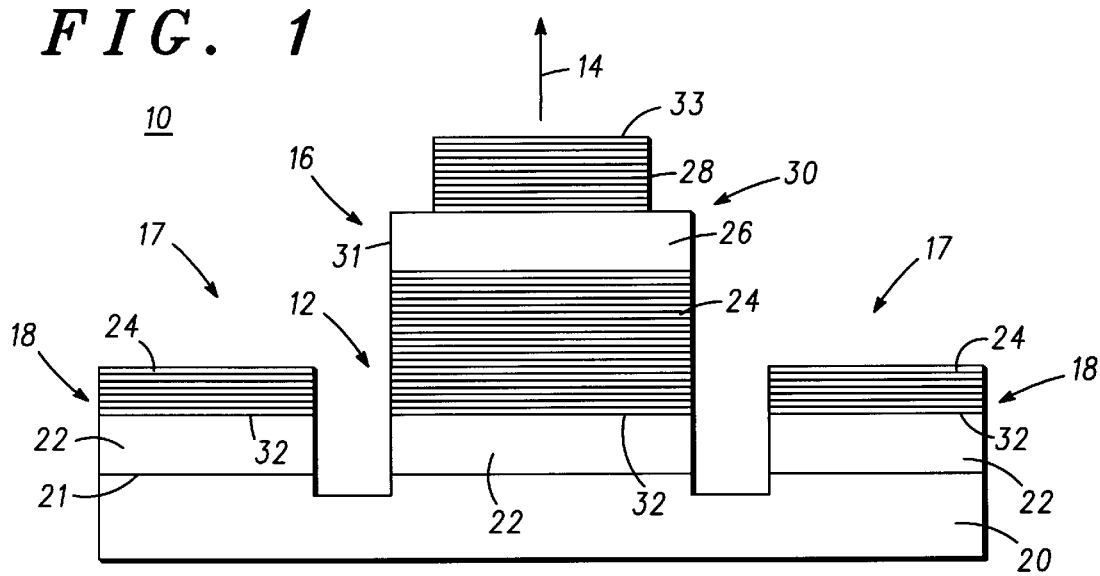
FIG. 1 is simplified sectional view of a VCSEL with a vertically integrated pin photodetector and laterally integrated photodetectors in accordance with the present invention.

FIG. 1 illustrates an integrated device 10 that includes a vertically integrated PIN photodetector 12 for measuring light, represented by an arrow 14, from a VCSEL 16. It should be noted that in FIG. 1, VCSEL 16 is represented by a ridge VCSEL. In addition, device 10 includes at least one laterally integrated PIN photodetector 18 for RF/tracking/focusing signal detection.

In this particular invention, device 10 is fabricated by disposing a plurality of layers on a substrate element 20. VCSEL 16 and vertically integrated photodetector 12 are subsequently fabricated by electrically isolating them from laterally integrated PIN photodetectors 18 (discussed presently) to complete device 10. In this particular embodiment, PIN photodetectors 12 and 18 are fabricated directly on substrate element 20. More particularly, PIN photodetectors 12 and 18 include a region of undoped material 22 deposited on an upper surface 21 of substrate element 20. Device 10 further includes the deposition of a first stack 24 of distributed Bragg reflectors (DBR), an active region 26, and a second stack 28 of distributed Bragg reflectors. As illustrated in FIG. 1, ridge VCSEL 16 is shown to include a ridge 30 defined by sidewalls 31 and a surface 33, utilized to define a light and current path, more particularly an optical pathway for the generated light illustrated by arrow 14, and to contain the current flowing through VCSEL 16.

Figure 2:
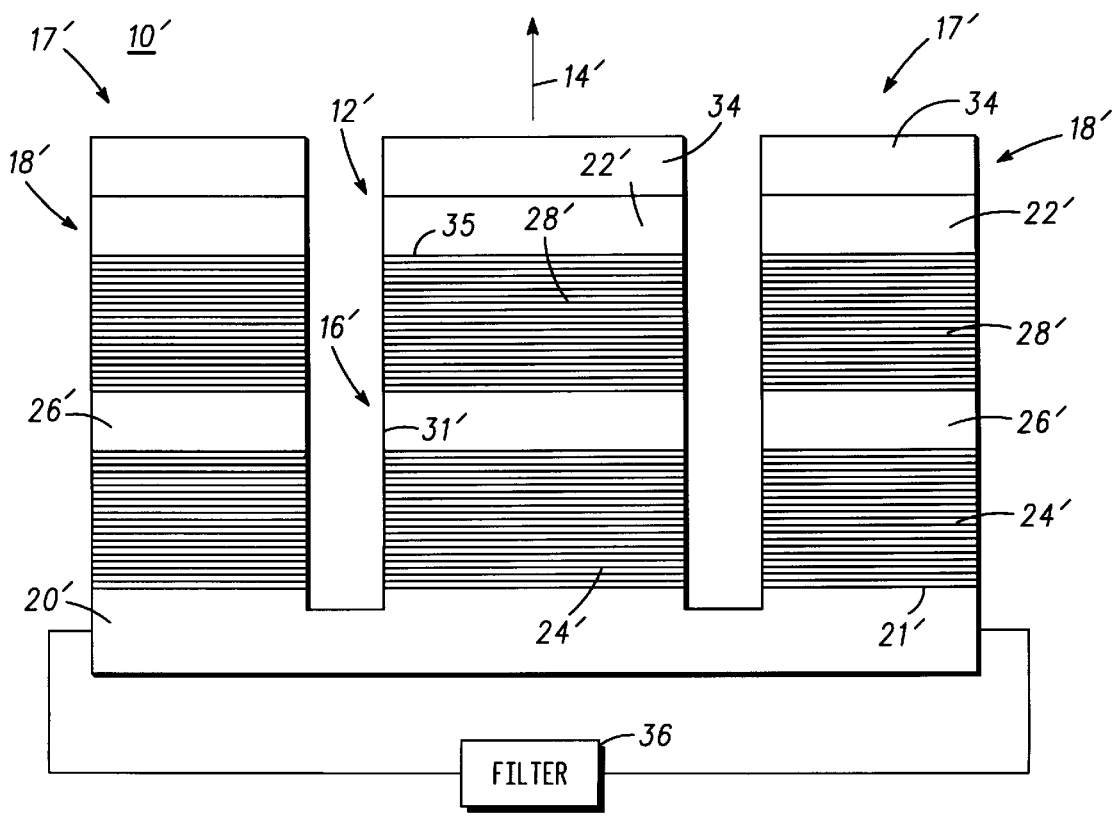
FIG. 2 is simplified sectional view of an alternative embodiment of a VCSEL with a vertically integrated pin photodetector and laterally integrated photodetectors in accordance with the present invention.
Figure 3:
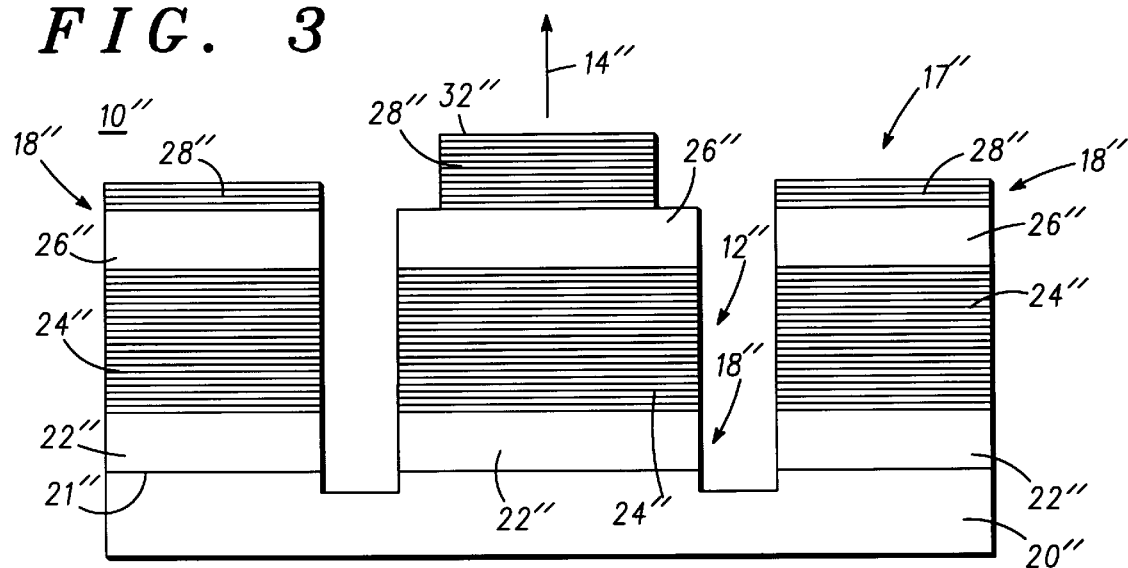
FIG. 3 is a simplified sectional view of yet another alternative embodiment of a VCSEL with a vertically integrated PIN photodetector and laterally integrated resonant cavity photodetectors in accordance with the present invention.

It should be understood that FIGS. 1–5 are simplified illustrations and that many elements have been purposefully omitted or simplified to more clearly illustrate the present invention. Further, it should be noted that FIGS. 1–3 are sectional views, thereby illustrating that the integrated devices extend into an out of the figure as well as to either side. It will be understood that the integrated devices represent a single integrated device or an array of integrated devices typically utilized in parallel data reading.

Generally, as shown in FIG. 1, device 10, including VCSEL 16, vertically integrated photodetector 12 and laterally integrated photodetectors 18 is made by any well-known method or process in the art. However, for the purposes of orienting the reader, a brief description of materials and methods is provided hereinbelow. Briefly, device 10 is fabricated on any suitable semiconductor substrate, such as gallium arsenide, indium phosphide, or the like where the semiconductor substrate provides surface 21. In this embodiment, substrate element 20 is a p-doped gallium arsenide semiconductor substrate. Undoped region 22, such as undoped gallium arsenide, is epitaxially deposited on surface 21 of substrate element 20 by any suitable method, such as molecular beam epitaxy (MBE), metal-organic chemical vapor deposition (MOCVD), or the like. Next, the first stack 24 of distributed Bragg reflectors, composed of alternating mirror pairs formed of n-doped $Al_{0.85}GaAs/Al_{0.15}GaAs$, active area 26, composed of multiple quantum wells of GaAs/AlGaAs, and the second stack 28 of distributed Bragg reflectors, composed of alternating mirror pairs formed of p-doped $Al_{0.85}GaAs/Al_{0.15}GaAs$, are epitaxially deposited on a surface 32 of undoped material 22 by any suitable method, such as molecular beam epitaxy (MBE), metal-organic chemical vapor deposition (MOCVD), or the like.

In the present embodiment, with the epitaxial depositions being completed, second stack 28 of distributed Bragg reflectors, active region 26 and first stack 24 of distributed Bragg reflectors are patterned to form ridge 30. More particularly, device 10 is patterned to electrically isolate VCSEL 16 and vertically integrated photodetector 12 from an adjacent structure 17, which will define laterally integrated photodetectors 18. Generally, this electrical isolation and formation of ridge 30 is made by any suitable well-known method in the art, such as photolithography, etching, lift-off, implants, any combination thereof, or the like. Typically, photolithography is used to electrically define the device utilizing either a wet etch, i.e., Nitric acid ($HNO_3$) plus Hydrofluoric acid (HF) solution or dry etch, i.e., a gas plasma containing fluorine ($CHF_3$). It should be understood that when selecting an etch method care should be used so as to provide the highest selectivity as reasonably possible.

By defining VCSEL 16, an optical path is defined in device 10 that reflects and guides light formed in active region or area 26 of VCSEL 16.

Laterally integrated photodetectors 18 are further defined by etching away second stack 28 of distributed Bragg reflectors, active region 26 and a portion, more particularly most of the mirror pairs, of first stack 24 of distributed Bragg reflectors. Accordingly, laterally integrated PIN photodetectors 18 are defined by substrate element 20, which in this particular embodiment is p-doped, undoped material 22 and the remaining portion of first stack 24 of distributed Bragg reflectors, which in this particular embodiment is n-doped.

Vertically integrated photodetector 12 is defined by substrate 20, undoped material 22 and the first stack 24 of distributed Bragg reflectors. VCSEL 16 is defined by first stack 24 of distributed Bragg reflectors, active region 26 and second stack 28 of distributed Bragg reflectors.

During operation, VCSEL 16 is forward biased and vertically integrated PIN photodetector 12 is reverse biased so as permit photodetector 12 to monitor the backward emission of VCSEL 16. It should be understood that vertically integrated photodetector 12 monitors the backward emission that is proportional to the forward emission. Laterally integrated photodetectors 18 are reverse biased, thereby monitoring ±1 order light that is emitted by VCSEL 16 and reflectively diffracted by a CD or DVD disk for signal analysis.

Referring now to FIG. 2, illustrated is a second embodiment of the device of the present invention. More particularly, illustrated is a device 10', generally similar to device 10 of FIG. 1, except in this particular embodiment integrated vertical and lateral photodetectors 12' and 18' are fabricated on an uppermost surface 35 of second stack 28' of distributed Bragg reflectors. It should be noted that all components similar to the components illustrated in FIG. 1, are designated with similar numbers, having a prime added to indicate the different embodiment.

In this particular embodiment, substrate element 20' is formed of a n-doped gallium arsenide semiconductor substrate having disposed on a surface 21', a n-doped first stack 24' of distributed Bragg reflectors. Active region 26', more particularly an undoped material such as gallium arsenide, is disposed on the n-doped first stack 24' of distributed Bragg reflectors. A p-doped second stack 28' of distributed Bragg reflectors is disposed on active region 26'. A region of undoped material 22' is then disposed on the second stack 28' of distributed Bragg reflectors, having a n-doped second electrical contact layer 34 disposed thereon. Second electrical contact layer 34 is made of any suitable transparent electrically conductive material or alloy, such as n-doped aluminum gallium arsenide (AlGaAs), or the like. A ring metal layer (not shown) provides an external electrical contact to contact layer 34 as one electrode for detector 12'. Another electrical contact is provided on substrate 20' so as to be coupled to first stack 24' of distributed Bragg reflectors. A common electrode is made in contact with second stack 28'.

Layers 28', 22' and 34 typically are made to correspond to a p-doped region, an undoped region or an intrinsic region, and an n-doped region, respectively, thereby forming vertically integrated PIN photodetector 12' and laterally integrated PIN photodetectors 18'. During operation PIN photodetector 12' is reverse biased, PIN photodetectors 18' are reverse biased, with layer 26' of intrinsic material in alignment with photodetectors 18' being unbiased. When light with a wavelength shorter than $\lambda g$ is emitted from the VCSEL, it will transmit through vertically integrated PIN photodetector 12' with a portion of the light absorbed by the detector. The thickness of the PIN photo detector is designed to absorb about 10–20% of the incident light with 80–90% of the light transmitted. The photons absorbed in the undoped region create electron-hole pairs. Due to either the built-in field or the external field if the PIN photodetector is reverse biased, the electrons will drift toward the n-contact region, or contact layer 34, and the holes will drift toward the p-contact region, or stack 28'. If there is a closed electrical loop between the n-contact and the p-contact, current flow can be detected. Depending on the magnitude of the current flow, which is proportional to the incident laser intensity, a feedback loop can be established to control the VCSEL injection current for VCSEL auto power control (APC). Accordingly, PIN photodetector 12' captures and measures a small percentage (approximately 10%) of the light (arrow 14') being emitted from VCSEL 16', thereby allowing the power output, i.e., light output of VCSEL 16', to be measured and subsequently adjusted to a desired level. Laterally integrated PIN photodetectors 18' capture and measure a reflected diffracted light from VCSEL 16' for RF/tracking/focusing signal detection.

It should be understood that any suitable p-type doping or n-type doping, such as carbon and silicon, respectively, can be used in doping of the plurality of layers. It should also be noted that doping levels for the PIN photodetectors of the present invention are well known and need not be discussed here. Additionally, it should be understood that throughout this disclosure the doping of the substrate element 20 and subsequent layers defining device 10 can be reversed.

Generally, the thickness is as thin as possible, thereby allowing a majority of light 14' to emanate from PIN photodetectors 12'. By way of example, assuming a ten (10) percent adsorption of the generated light (arrow 14') and a coefficient of absorption of 1000 $cm^{-1}$, the thickness of region 22' will be approximately 1 micron (10,000 Angstroms). However, it should be understood that the thickness of region 22' is dependent on a wavelength of the generated light.

During operation, reflected modulated 0 order light will interfere with accurate automatic power control (APC) monitoring by vertically integrated photodetector 12'. Accordingly, there is provided an electronic filter 36, also referred to as a low pass filter, which allows only direct current (DC) frequencies of light to pass through. This allows vertically integrated photodetector 12' to not "see", thus ignore, any reflected modulated 0 order light that is reflected by the CD or DVD disk.

Referring now to FIG. 3, illustrated is a third embodiment of the device of the present invention, designated 10". It should be noted that all components similar to the components illustrated in FIGS. 1 and 2, are designated with similar numbers, having a double prime added to indicate the different embodiment. This particular embodiment is generally similar to the first embodiment previously described with reference to FIG. 1, except in this particular embodiment, laterally integrated photodetectors 18" are fabricated on top of region 22" of undoped material and are characterized as resonant cavity photodetectors, including a highly reflective stack of distributed Bragg reflectors fabricated on one side of an undoped material, thereby wavelength selective and highly efficient.

As illustrated, vertically integrated photodetector 12" and laterally integrated photodetectors 18" are fabricated generally similar to FIG. 1 except in this particular embodiment during the electrical isolation of VCSEL and vertically integrated photodetector 12" from laterally integrated photodetectors 18", intrinsic material or undoped region 26" and second stack 28" of distributed Bragg reflectors of photodetectors 18" are left remaining. In particular, only a portion of stack 28" is removed, thereby leaving stack 24", intrinsic layer 26" and a portion of stack 28" to form laterally integrated photodetectors 18" for RF/tracking/focusing signal detection and monitoring. In this particular embodiment, substrate element 20" is p-doped, first stack 24" of distributed Bragg reflectors is n-doped, and second stack 28" of distributed Bragg reflectors is p-doped. Accordingly, substrate element 20", undoped intrinsic material 22" and a portion of first stack 24" of distributed Bragg reflectors define vertically integrated photodetector 12", operable generally similar to photodetector 12 of FIG. 1. Again, as previously stated with regard to the prior embodiments, the doping of the substrate element 20" and subsequent layers defining device 10 can be reversed.

Figure 4:
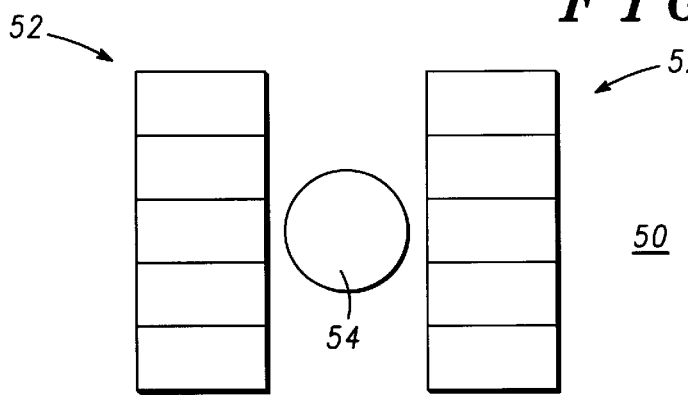
FIG. 4 is a simplified top view showing a vertical cavity surface emitting laser and laterally integrated multi-sectional photodetectors.
Figure 5:
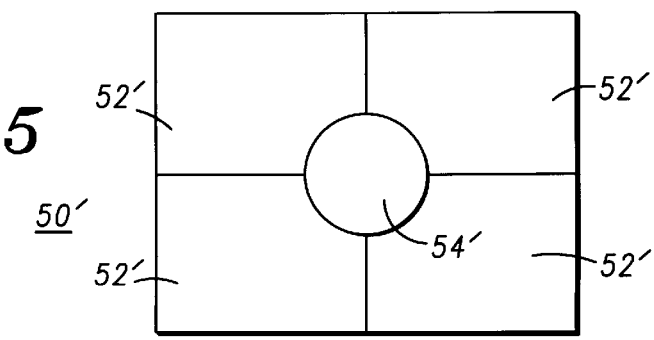
FIG. 5 is a simplified top view showing a vertical cavity surface emitting laser and a laterally integrated four-section photodetector.

Referring now to FIGS. 4–5, illustrated in simplified top views are alternative embodiments of the device of the present invention. More particularly, illustrated in FIG. 4 is a multi-sectional photodetector and VCSEL, generally designated 50. Device 50 is composed of multi-sectional PIN photodetectors 52, fabricated generally similar to laterally integrated photodetectors 18 of FIGS. 1–3. As illustrated, there is provided a VCSEL 54 with a vertically integrated photodetector (not shown). Referring to FIG. 5, illustrated is a four-section PIN photodetector and VCSEL, generally designated 50'. Device 50' is composed of a four-sectioned PIN photodetector 52', fabricated generally similar to laterally integrated photodetectors 18 of FIGS. 1–3. As illustrated, there is provided a VCSEL 54' with a vertically integrated photodetector (not shown).

In the disclosed embodiments it should be understood that the vertically and laterally integrated PIN photodetectors can be either reverse biased, or without bias, if the PIN photodetectors speeds are not a concern. In addition, the doping of the substrate and remaining layers that form the VCSEL, the vertically integrated photodetector and the laterally integrated photodetectors can be reversed.

By now it should be appreciated that a novel device including a VCSEL with a vertically integrated PIN photodetector and laterally integrated photodetectors and method for fabrication have been disclosed. The VCSEL is integrated with a vertical PIN photodetector, thereby enabling the light output of the VCSEL to be easily monitored and subsequently adjusted to a desired level. In addition, there is provided at least one laterally integrated photodetector, thereby enabling the reflected diffracted light signal to be detected and monitored for RF/tracking/focusing signal reading. Additionally, since the VCSEL and the vertically and laterally integrated PIN photodetectors are fabricated as one device, the integrated device is highly manufacturable, thus reducing cost and allowing significant improvements in reliability and quality. Although, 850 nm VCSEL us used as an example, the same technology applies to 780 nm VCSEL and 650–635 nm VCSELs.

While we have shown and described specific embodiments of the present invention, further modifications and improvements will occur to those skilled in the art. We desire it to be understood, therefore, that this invention is not limited to the particular forms shown and we intend in the appended claims to cover all modification that do not depart from the spirit and scope of this invention.

What is claimed is:

1. A vertical cavity surface emitting laser with integrated PIN photodetectors comprising:

a first stack of distributed Bragg reflectors, an active area disposed on the first stack of distributed Bragg reflectors, and a second stack of distributed Bragg reflectors disposed on the active area, the first and second stacks of distributed Bragg reflectors and the active area fabricated so as to define a resonant cavity vertical cavity surface emitting laser characterized by an optical pathway through which light is generated and passes and an adjacent structure, the resonant cavity vertical cavity surface emitting laser further including first and second stacks of distributed Bragg reflectors respectively for supplying operating power thereto: and a region of an undoped material disposed in the optical pathway of the resonant cavity vertical cavity surface emitting laser and in alignment with the adjacent structure, the region of undoped material defining a plurality of integrated PIN photodetectors.

2. A vertical cavity surface emitting laser with integrated PIN photodetectors as claimed in claim 1 wherein the plurality of integrated PIN photodetectors define a vertically integrated PIN photodetector in alignment with the resonant cavity vertical cavity surface emitting laser for automatic power control (APC) of the resonant cavity vertical cavity surface emitting laser and at least one laterally integrated PIN photodetector for RF/tracking/focusing signal detection in optical data storage systems.

3. A vertical cavity surface emitting laser with integrated PIN photodetectors as claimed in claim 2 wherein the vertically integrated PIN photodetector fabricated in the optical pathway of the resonant cavity vertical cavity surface emitting laser monitors a backward emission from the resonant cavity vertical cavity surface emitting laser and the at least one laterally integrated PIN photodetector monitors ±1 order light.

4. A vertical cavity surface emitting laser with integrated PIN photodetectors as claimed in claim 1 wherein the region of undoped material disposed in the optical pathway of the resonant cavity vertical cavity surface emitting laser and in alignment with the adjacent structure, is disposed on a surface of a substrate element, the first stack of distributed Bragg reflectors disposed on an upper surface of the region of undoped materials, the substrate element characterized as a first electrical contact for the integrated PIN photodetectors.

5. A vertical cavity surface emitting laser with integrated PIN photodetectors as claimed in claim 1 wherein the region of undoped material disposed in the optical pathway of the resonant cavity vertical cavity surface emitting laser and in alignment with the adjacent structure is disposed on an uppermost surface of the second stack of distributed Bragg reflectors.

6. A vertical cavity surface emitting laser with integrated PIN photodetectors as claimed in claim 5 wherein the integrated PIN photodetectors further include a second electrical contact layer positioned on an uppermost surface of the region of undoped material.

7. A vertical cavity surface emitting laser with integrated PIN photodetectors as claimed in claim 1 wherein the region of undoped material is made of gallium arsenide (GaAs).

8. A vertical cavity surface emitting laser with integrated PIN photodetectors comprising:

a resonant cavity vertical cavity surface emitting laser with a vertically integrated APC monitoring photodetector and at least one laterally integrated RF/tracking/focusing signal monitoring photodetector, including a first stack of distributed Bragg reflectors, an active area disposed on the first stack of distributed Bragg reflectors, and a second stack of distributed Bragg reflectors disposed on the active area, the resonant cavity vertical cavity surface emitting laser and integrated photodetectors fabricated to define an optical pathway through which light is generated and passes and at least one adjacent structure, the resonant cavity vertical cavity surface emitting laser further including a first electrical contact coupled to the first stack for supplying operating power thereto and a second electrical contact coupled to the second stack for supplying operating power thereto; and a region of undoped material disposed in the optical pathway of the resonant cavity vertical cavity surface emitting laser and in alignment with the at least one adjacent structure, the region of undoped material further defining the vertically integrated APC monitoring photodetector and the at least one laterally integrated RF/tracking/focusing signal monitoring photodetector.

9. A vertical cavity surface emitting laser with integrated PIN photodetectors as claimed in claim 8 wherein the resonant cavity vertical cavity surface emitting laser and the vertically integrated APC monitoring photodetector are electrically isolated from the at least one laterally integrated RF/tracking/focusing signal monitoring photodetector by one of implant or etching.

10. A vertical cavity surface emitting laser with integrated PIN photodetectors as claimed in claim 9 wherein the region of undoped material includes gallium arsenide (GaAs).

11. A vertical cavity surface emitting laser with integrated PIN photodetectors as claimed in claim 9 wherein the vertically integrated APC monitoring photodetector monitors an emission from the resonant cavity vertical cavity surface emitting laser emission and the at least one laterally integrated RF/tracking/focusing signal monitoring photodetector monitors ±1 order light diffracted from an optical recording media.

12. A vertical cavity surface emitting laser with integrated PIN photodetectors as claimed in claim 9 wherein the region of undoped material is disposed on a surface of a substrate element, the first stack of distributed Bragg reflectors disposed on an upper surface of the region of undoped material.

13. A vertical cavity surface emitting laser with integrated PIN photodetectors as claimed in claim 12 wherein the substrate element, the region of undoped material and a portion of the first stack of distributed Bragg reflectors define the vertically integrated APC monitoring photodetector and the at least one laterally integrated RF/tracking/focusing signal monitoring photodetector.

14. A vertical cavity surface emitting laser with integrated PIN photodetectors as claimed in claim 9 wherein the region of undoped material is disposed on a surface of the second stack of distributed Bragg reflectors, a contact layer being disposed on an upper surface of the region of undoped material.

15. A vertical cavity surface emitting laser with integrated PIN photodetectors as claimed in claim 14 wherein a portion of the second stack of distributed Bragg reflectors, the region of undoped material and the contact layer define the vertically integrated APC monitoring photodetector and the at least one laterally integrated RF/tracking/focusing signal monitoring photodetector.

16. A method of fabricating a vertical cavity surface emitting laser with integrated PIN photodetectors comprising the steps of forming a device to include a resonant cavity vertical cavity surface emitting laser having a vertically integrated APC PIN photodetector and at least one laterally integrated RF/tracking/focusing signal PIN monitoring photodetector.

17. A method of fabricating a vertical cavity surface emitting laser with integrated PIN photodetectors as claimed in claim 16 wherein the step of forming a device to include a resonant cavity vertical cavity surface emitting laser and integrated photodetectors includes the steps of forming a first stack of distributed Bragg reflectors, an active area disposed on the first stack of distributed Bragg reflectors, and a second stack of distributed Bragg reflectors disposed on the active area, disposing a region of undoped material in alignment with the first and second stacks of distributed Bragg reflectors and the active area, electrically isolating the resonant cavity vertical cavity surface emitting laser and vertically integrated APC PIN photodetector from the at least one laterally integrated RF/tracking/focusing signal monitoring PIN photodetector, thereby defining an optical pathway for the resonant cavity vertical cavity surface emitting laser.

18. A method of fabricating a vertical cavity surface emitting laser with integrated PIN photodetectors as claimed in claim 17 where, in the step of forming the region of undoped material, the undoped material is gallium arsenide.

19. A method of fabricating a vertical cavity surface emitting laser with integrated PIN photodetectors as claimed in claim 17 wherein the step of electrically isolating the resonant cavity vertical cavity surface emitting laser and vertically integrated APC PIN photodetector from the at least one laterally integrated RF/tracking/focusing signal monitoring PIN photodetector include, defining the resonant cavity vertical cavity surface emitting laser and vertically integrated APC PIN photodetector from the laterally RF/tracking/focusing signal monitoring PIN integrated photodetector by at least one of a photolithography process, an etching process and an implant process.

* * * * *